United States Patent [19]

Mikata et al.

[11] Patent Number: 5,766,785
[45] Date of Patent: Jun. 16, 1998

[54] METHOD AND APPARATUS FOR MANUFACTURING A SEMICONDUCTOR DEVICE

[75] Inventors: Yuuichi Mikata, Kawasaki, Japan; Takashi Nakao, Fishkill; Yoshitaka Tsunashima, Parghkeepsie, both of N.Y.

[73] Assignee: Kabushiki Kaisha Toshiba, Kawasaki, Japan

[21] Appl. No.: 506,134

[22] Filed: Jul. 24, 1995

Related U.S. Application Data

[63] Continuation of Ser. No. 227,890, Apr. 15, 1994, abandoned.

[30] Foreign Application Priority Data

Apr. 16, 1993 [JP] Japan ............................. 5-090030

[51] Int. Cl.⁶ .............................................. H01L 21/00
[52] U.S. Cl. ..................................... 438/723; 438/906
[58] Field of Search ............................. 156/345; 134/1.2, 134/1.3, 2; 438/706, 723, 906

[56] References Cited

U.S. PATENT DOCUMENTS

| | | | |
|---|---|---|---|
| 4,340,456 | 7/1982 | Robinson et al. | 156/643 X |
| 5,015,330 | 5/1991 | Okumura et al. | 156/643.1 |

*Primary Examiner*—Thi Dang
*Attorney, Agent, or Firm*—Finnegan, Henderson, Farabow, Garrett & Dunner, L.L.P.

[57] ABSTRACT

To react the surfaces of a plurality of semiconductor substrates to be treated to reducing gas in a treating chamber, their corresponding members having surfaces opposite to those surfaces of the substrates on which semiconductor devices are to be manufactured, are arranged. The amount of reducing agent supplied to the surfaces of the substrates is controlled by controlling the reaction of the surfaces of the members to the reducing gas, and the progress of the reducing reaction to each of the substrates is controlled accordingly.

12 Claims, 2 Drawing Sheets

METHOD AND APPARATUS FOR MANUFACTURING A SEMICONDUCTOR DEVICE

This application is a continuation of application Ser. No. 08/227,890, filed Apr. 15, 1994, now abandoned.

BACKGROUND OF THE INVENTION

1. Field of the Invention

The present invention relates to a method and an apparatus for manufacturing a semiconductor device and, more particularly, to a method and an apparatus for manufacturing a semiconductor device including a step of eliminating natural oxide films from two or more semiconductor substrates at once in the same treating chamber.

2. Description of the Related Art

A natural oxide film formed on the surface of a semiconductor substrate frequently comes into question in the process of manufacturing a semiconductor device. For example, when a natural oxide film is formed on silicon of the surface of a contact hole, if high melting point metal such as tungsten (W) is formed in the contact hole, contact resistance increases. When a natural oxide film is formed on a polysilicon layer containing phosphorus (P), which serves as a lower electrode of a capacitor, if a capacitor insulation layer is formed between the upper and lower electrodes of the capacitor, the capacitance of the capacitor decreases. It is thus necessary to remove the natural oxide films from the contact hole on the semiconductor substrate and the electrodes of the capacitor in advance before the high melting point metal of tungsten or the like or the capacitor insulation layer is formed.

One method for eliminating a natural oxide film in the process of manufacturing a semiconductor device is to reduce and resolve the natural oxide film by high-temperature annealing in a reductive atmosphere.

To eliminate a natural oxide film using hydrogen as a reducing agent, high-temperature annealing of 1000° C. or more is required. However, taking into consideration that an impurity diffusion layer is formed shallowly in order to improve high degree of integration of a semiconductor device, the high-temperature annealing is an adequate heat treatment process.

If a natural oxide film is eliminated by etching using hydrogen halide such as hydrogen chloride and hydrogen fluoride, not only the natural oxide film but also its underlayer, a silicon substrate and a polysilicon layer will be etched, with the result that the underlayer is damaged.

When silicon hydride such as monosilane is used as a reducing agent to remove a natural oxide film, the temperature of annealing is lower (below 1000° C.) than when using hydrogen, and neither a silicon substrate nor a polysilicon layer, which serves as an underlayer of the natural oxide film, is etched. If, however, the silicon hydride is supplied excessively into a treating chamber, polysilicon is deposited on the natural oxide film before the natural oxide film is eliminated from the surface of the semiconductor substrate.

A treating unit capable of simultaneously treating a plurality of semiconductor wafers in a single treating container will be described as one apparatus for eliminating a natural oxide film from the surface of a semiconductor substrate using silicon hydride.

First, the treating unit necessitates uniform supply of reducing gas to each of the wafers. It is however difficult to uniformly supply reducing gas to a wafer provided near an inlet of the treating container for the reducing gas and to a wafer provided far from the inlet (or near an outlet for the reducing gas), as in the case of a CVD apparatus having the same gas supply system.

There are many cases where not only the natural oxide film but also another oxide layer, for example, a silicon oxide layer serving as an element isolation layer and an interlayer insulation layer is formed on the surface of the semiconductor substrate. Since the silicon oxide layer and other oxides absorb reducing agents as the natural oxide film does, the amount of reducing agent supplied to the natural oxide film is virtually decreased, and the effect of eliminating the natural oxide film is lessened. Since, furthermore, the partial pressure of a reactive product produced by the reducing reaction of the silicon oxide layer is heightened, the reducing reaction to the natural oxide film becomes hard to advance.

In the treating unit for simultaneously treating a plurality of semiconductor wafers to remove natural oxide films therefrom in the same treating chamber, the ratio of the area of the surface of each semiconductor wafer to that of the surface of the oxide such as the silicon oxide layer occupying the semiconductor wafer, varies according to the process of forming the semiconductor substrate and the type of the semiconductor device.

Even though gas is uniformly supplied to each wafer in the above treating unit, the amount of reducing agent has to be increased or decreased in accordance with the occupation rate of the oxide layer on the surface of the wafer in order to make the partial pressure of the reducing gas and that of the reactive product constant.

The foregoing conventional treating unit for eliminating a natural oxide film from the surface of a semiconductor substrate by reducing reaction has a drawback wherein no reducing agents can be uniformly supplied to each of a plurality of semiconductor wafers in order to treat the semiconductor wafers at the same time.

SUMMARY OF THE INVENTION

It is an object of the present invention to provide a method and an apparatus for manufacturing a semiconductor device in which, even if reduction treatment is performed for a plurality of substrates at the same time, the amount of consumption of reducing agents can be controlled in accordance with the states of the surfaces of the substrates so that the amount can be made closer to the optimum value.

To attain the above object, a method for manufacturing a semiconductor device according to one aspect of the present invention, comprises the steps of:

arranging a plurality of substrates to be treated and a plurality of members in a treating chamber in such a manner that an undersurface of each member is opposed to a surface of a substrate corresponding to the member; and controlling reaction of a reducing agent to the undersurface of the member to supply a reducing gas whose amount is controlled, to the surface of the substrate.

An apparatus for manufacturing a semiconductor device according to another aspect of the present invention comprises:

a receiver on which a plurality of substrates to be treated are arranged at regular intervals in parallel to one another;

a treating chamber in which the receiver is located;

gas guiding means for guiding a reducing gas into the treating chamber;

gas exhausting means for exhausting a gas from the treating chamber; and members having undersurfaces opposite to respective surfaces of the plurality of substrates, the members being mounted on the receiver, at least part of an undersurface of each members being formed of a material for controlling reducing reaction on a surface of each substrate, and the members controlling a partial pressure of reducing gas or a partial pressure of reactive product gas by reaction to the reducing gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described in detail, with reference to the accompanying drawings.

Figure 1:
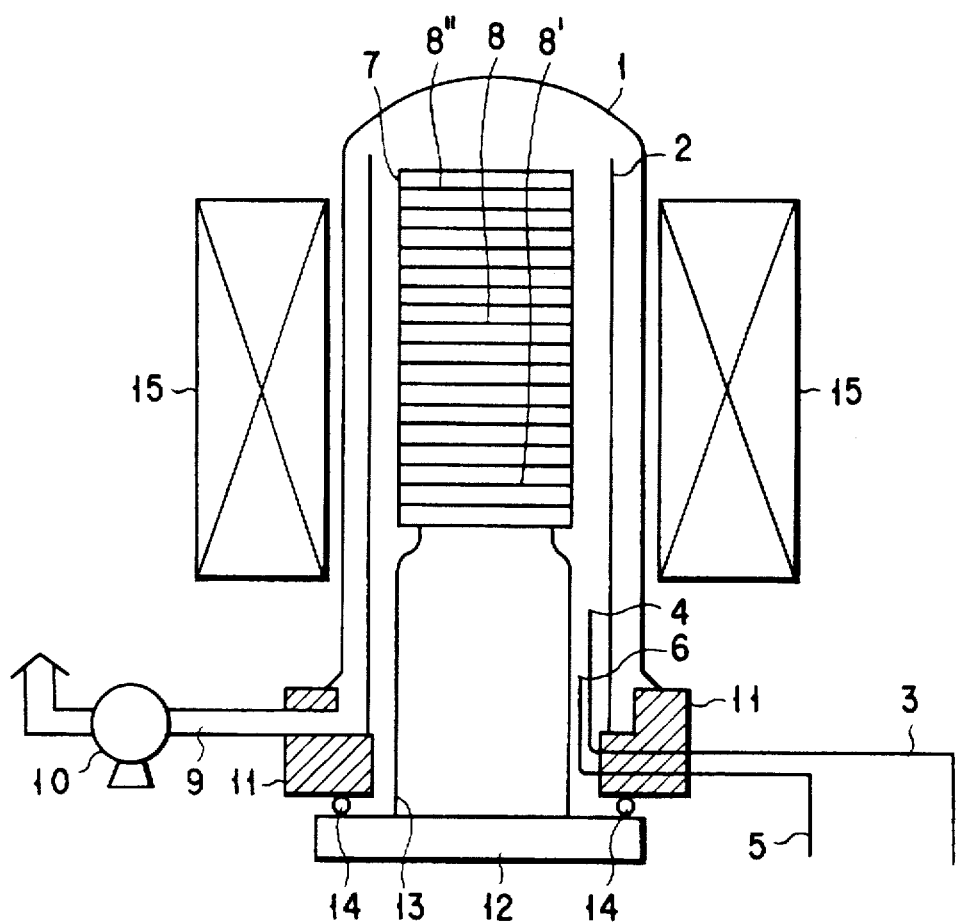
FIG. 1 is a view showing a constitution of an LPCVD apparatus which is used for forming a silicon nitride layer after a natural oxide film is eliminated in a method for manufacturing a semiconductor device according to a first embodiment of the present invention.

FIG. 1 schematically shows a constitution of an LPCVD (Low Pressure Chemical Vapor Deposition) apparatus for use in a method of manufacturing a semiconductor device according to a first embodiment of the present invention.

The LPCVD apparatus shown in FIG. 1 is so constructed that a silicon nitride layer can be formed by LPCVD after a natural oxide film is eliminated from the surface of a semiconductor substrate using monosilane gas as a reducing agent.

The LPCVD apparatus includes a quartz-made treating chamber, and this chamber has a double structure of a quartz-made outer tube 1 which is airtight and a quartz-made inner tube 2 whose upper end is open. The outer and inner tubes 1 and 2 are supported by a first support 11 which is made of SUS (stainless of Japanese Industrial Standard). The inner tube 2 includes a quartz-made receiver 7 having a boat of shelves in which a plurality of semiconductor substrates 8 to be treated can be arranged at regular intervals in parallel to one another. The receiver 7 and substrates 8 are supported by a second support 12 made of SUS, with a quartz-made heat insulating cylinder 13 interposed between them.

The second support 12 can be lifted and lowered. As shown in FIG. 1, when the second support 12 is lifted, the receiver 7 and substrates 8 are located inside the inner tube 2, and an airtight state between the first and second supports 11 and 12 is maintained by a heat-resisting O-shaped ring 14, with the result that the treating chamber remains airtight. On the other hand, when the second support 12 is lowered, the receiver 7 and substrates 8 are located below the outer and inner tubes 1 and 2 to remove the substrates 8 therefrom.

A heater 15 is provided outside the outer tube 1 and used for heating the insides of the outer and inner tubes 1 and 2 and the substrates 8. The heat insulating cylinder 13 is provided to prevent the first and second supports 11 and 12 from being heated by radiant heat of the treating chamber. Gas conduits 3 and 5 pass through the first support 11, and their respective blow-off nozzles 4 and 6 are located inside the inner tube 2. The conduits 3 and 5 guide monosilane gas serving as reducing gas and material gas, inert gas such as argon, and ammonia gas from outside the treating chamber into the inner tube 2. An exhaust pipe 9 goes through the first support 11 and communicates with a vacuum pump 10 outside the treating chamber, while its end is located between the outer and inner tubes 1 and 2. Thus, the gas blown into the inner tube 2 is thermally reacted to the surfaces of the substrates 8. The reacted gas and unreacted gas are then supplied from the upper portion of the inner tube 2 and discharged from the exhaust pipe 9 through a gap between the outer and inner tubes 1 and 2.

A method for forming silicon nitride layers after natural oxide films are eliminated from the surfaces of the substrates 8 to be treated, using the above-described LPCVD apparatus, will now be described.

The treating chamber is heated up to 850° C. and exhausted to obtain a vacuum the pressure of which is $1 \times 10^{-5}$ Torr or less. After that, monosilane gas having a flow rate of 2 SCCM is supplied into the treating chamber from the blow-off nozzle 4. This monosilane gas is heated in the treating chamber and reaches the substrates 8 placed on the receiver 7. Then, the natural oxide films on the surfaces of the substrates 8, that is, silicon oxide layers such as $SiO_2$ and LOCOS oxide films are eliminated by the reducing reaction represented by the following formula (1).

$$SiH_4 \rightarrow SiH_2 + H_2 \uparrow$$
$$SiH_2 + SiO_2 \rightarrow 2SiO\uparrow + H_2\uparrow \qquad (1)$$

The monosilane gas is first supplied to near a substrate 8' which is provided at the relatively lower portion of the receiver 7, and part of the monosilane gas is consumed by the reducing reaction given by the formula (1). Thus, the partial pressure of the monosilane gas supplied to near a substrate 8" which is provided at the relatively upper portion of the receiver 7, is lower than that of the monosilane gas supplied to near the substrate 8'. Therefore, when the elimination of a natural oxide film from the substrate 8' is finished, a natural oxide film cannot be completely removed from the substrate 8" since the partial pressure of the monosilane gas is low in the vicinity of the surface of the substrate 8".

If the total partial pressure of monosilane gas is heightened by increasing the flow rate of the monosilane gas from 2 SCCM to 4 SCCM, it is too high in the vicinity of the substrate 8' placed at the lower portion of the receiver 7, with the result that deposition reaction occurs on the silicon layer before the natural oxide film is removed from the substrate 8'. The deposition reaction is expressed by the following reaction formula (2).

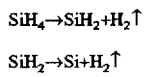

A method for supplying the monosilane gas to the substrates 8 at an appropriate partial pressure.

When the monosilane gas is supplied to the substrates 8 mounted on the receiver 7, the reducing reaction expressed by the formula (1) occurs on not only the surfaces (to be treated) of the substrates 8 but also on their opposite surfaces. A member (e.g., dummy silicon substrate) having a plate-like surface is mounted such that its surface is opposite to that of each substrate 8 on which a semiconductor device is to be manufactured. A material capable of controlling the progress of reducing reaction to the natural oxide film on the substrate 8, is used for at least part of the surface of the member. To control this, the partial pressure of the monosilane gas is controlled by the reaction of the monosilane gas to the material, or the partial pressure of the gas generated by the reaction is controlled and, in other words, the amount of consumption of the monosilane gas is controlled. Accordingly, the amount (percentage) of the monosilane gas supplied to the substrates 8 is controlled.

With the above constitution, reducing gas is introduced into the treating chamber housing the plural substrates 8, and flows to the receiver 7. The reducing gas then flows into a gap between the substrates 8 and the dummy silicon substrates. After that, the natural oxide films on the surfaces of the substrates 8 and those on the dummy silicon substrates opposite to the substrates 8, are reduced. If, in this case, at least part of the surface of each of the dummy silicon substrates, is covered with a material which is hard to react to the reducing gas, the consumption of the reducing gas is lessened on this part, resulting in reduction of occurrence of reactive products. Consequently, the partial pressure of the reduced gas in a gap between the substrates 8 and their corresponding dummy silicon substrates is made higher and the partial pressure of the reactive products is made lower than in the case where no dummy silicon substrates are mounted on the receiver 7.

A case where at least part of the surface of the dummy silicon substrate opposite to each of the substrates 8, is covered with a material which is easy to react to the reducing gas, will now be described. In this case, the reducing gas flows into a gap between the substrates 8 and their opposite dummy silicon substrates and, when the natural oxide films of the substrates 8 and those of the dummy silicon substrates are reduced, the amount of consumption of reducing agents on the surfaces of the dummy silicon substrates is equal to or larger than that on the surfaces of the substrates 8. As a result, the amount of reducing agent in the gap between the substrates 8 and dummy silicon substrates is decreased. The partial pressure of the reducing agents is lowered, and that of the reactive products is enhanced.

By combining the two operations described above, the partial pressure of reducing agents supplied to each of the substrates 8 can be controlled, and so can be the partial pressure of a reactive product. This control allows natural oxide films to be removed from all the substrates 8 under the optimum conditions.

Figure 2:
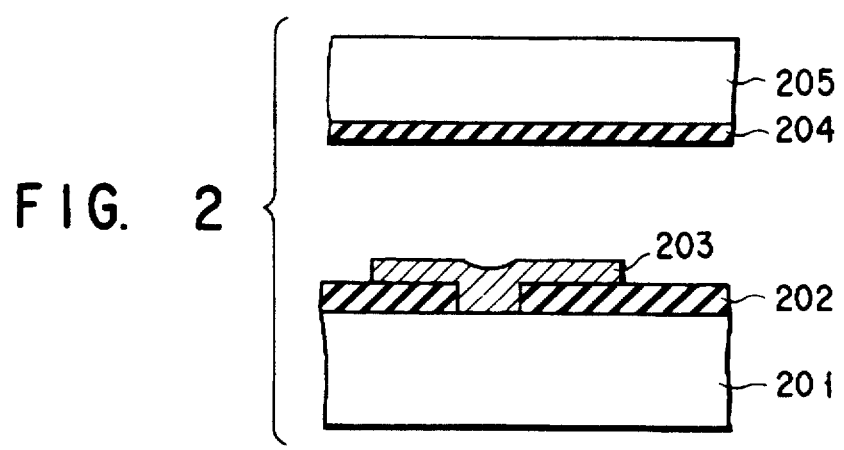
FIG. 2 is a view for explaining a method of decreasing the partial pressure of reducing agents supplied to substrates to be treated which are mounted on a treated substrate receiver of the LPCVD apparatus shown in FIG. 1.

FIG. 2 shows an example of a method for increasing the partial pressure of monosilane gas supplied to the substrates 8, with respect to the first embodiment.

A silicon oxide layer 202 is formed on the surface of a silicon substrate 201 corresponding to one of the substrates 8, and a polysilicon layer 203 is formed on part of the layer 202. Assume that a natural oxide film on the polysilicon layer 203 is eliminated.

The silicon substrate 201 is placed on one of shelves of the receiver 7 shown in FIG. 1. A silicon substrate 205 is placed on the uppermost shelf. The undersurface of the silicon substrate 205, that is, the surface opposite to that of the substrate 201 (on which a semiconductor device is to be manufactured) is covered with a material (e.g., silicon nitride film 204) which is harder to react to monosilane gas than a silicon oxide layer.

The monosilane gas flowing into a gap between the silicon substrates 201 and 205 is consumed by the reducing reaction to the natural oxide film on the polysilicon layer 203, as expressed by the formula (1). Similarly, the reducing reaction occurs on an exposed portion of the silicon oxide layer 202. Thus, the monosilane gas is consumed and SiO is produced as a reactive product.

In contrast, no reducing reaction occurs on the undersurface of the silicon substrate 205, because a natural oxide film is hardly formed on the surface of the silicon nitride layer 204. Therefore, the monosilane gas is hardly consumed, and SiO is not produced on the undersurface of the silicon substrate 205.

If the undersurface of the silicon substrate 205 is covered with not the silicon nitride layer 204 but a natural oxide film, the monosilane gas will be consumed by the reducing reaction to the natural oxide film, and SiO will be produced. Providing the silicon nitride layer 204 on the undersurface of the silicon substrate 205 suppresses the consumption of monosilane gas, with the result that the partial pressure of monosilane gas can be increased more than in the case of providing no silicon nitride layer on the undersurface of the silicon substrate 205. In other words, the partial pressure of SiO can be decreased, and the reducing reaction to the substrates 8 can be promoted.

Figure 3:
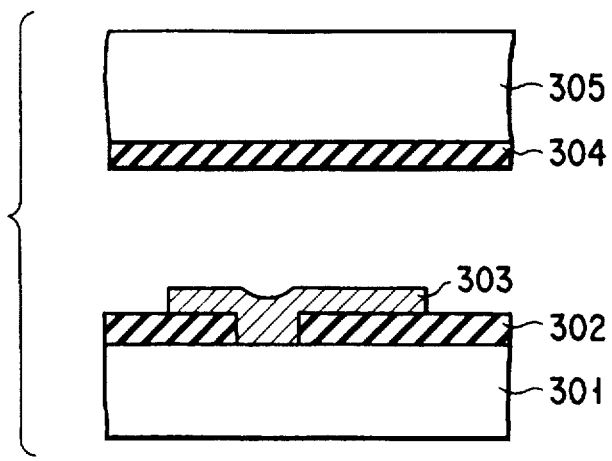
FIG. 3 is a view for explaining a method of increasing the partial pressure of reducing agents supplied to the substrates to be treated which are mounted on the treated substrate receiver of the LPCVD apparatus shown in FIG. 1.

Contrary to the above, FIG. 3 shows an example of a method for decreasing the partial pressure of monosilane gas supplied to the substrates 8, with respect to the first embodiment.

A silicon oxide layer 302 is formed on the surface of a silicon substrate 301 corresponding to one of the substrates 8, and a polysilicon layer 303 is formed on part of the layer 302. Assume that a natural oxide film on the polysilicon layer 303 is eliminated.

The silicon substrate 301 is placed on one of shelves of the receiver 7 shown in FIG. 1. A silicon substrate 305 is placed on the uppermost shelf. The undersurface of the silicon substrate 305, that is, the surface opposite to that of the substrate 301 (on which a semiconductor device is to be manufactured) is covered with a silicon oxide layer 304.

The monosilane gas flowing into a gap between the silicon substrates 301 and 305 is consumed by the reducing reaction to the natural oxide film on the polysilicon layer 303, as expressed by the formula (1). The reducing reaction also occurs on an exposed portion of the silicon oxide layer 302. The monosilane gas is consumed accordingly. Similarly, the reducing reaction occurs on the surface of the silicon oxide layer 304, and the monosilane gas continues to be consumed.

In contrast, if the undersurface of the silicon substrate 305 is covered with not the silicon oxide layer 304 but a natural oxide film, the monosilane gas is consumed by the reducing reaction to the natural oxide film. After all the natural oxide film is removed, the consumption of the monosilane gas is stopped.

Therefore, the monosilane gas is continuously consumed by forming the silicon oxide layer 304 on the undersurface of the silicon substrate 305 so as to have a thickness enough to prevent all the silicon oxide layer from being eliminated by the reducing reaction. The consumption of the monosilane gas is increased, and the partial pressure of the monosilane gas can be lowered. In other words, the partial pressure of the reactive product, SiO can be heightened by increasing in generation of SiO. Consequently, the reducing reaction to the substrates 8 can be suppressed.

Using the above-described method according to the first embodiment, in the LPCVD apparatus shown in FIG. 1, the silicon nitride layer 204 is provided on the surface opposite to the surface of the substrate 8" located at the upper portion of the receiver 7, and the consumption of monosilane gas can be suppressed on the opposite surface. Consequently, the partial pressure of the monosilane gas can be increased, and the reducing reaction to the substrate 8" can be promoted accordingly.

Contrary to the above, the silicon oxide layer 304 is formed on the surface opposite to the surface of the substrate 8' located at the lower portion of the receiver 7, and the flow rate of monosilane gas is increased to, for example, 4 SCCM, thereby increasing the partial pressure of the silane gas in total. The consumption of the monosilane gas can thus be increased on the opposite surface, and the partial pressure of the monosilane gas can be lowered. It is thus possible to prevent polysilicon from being deposited on the substrate 8' due to the high partial pressure of the monosilane gas, and it is also possible to prevent the reducing reaction from being caused insufficiently at the upper portion of the receiver 7 because of the low partial pressure of the monosilane gas.

Consequently, the natural oxide films can be eliminated from all the substrates 8 with high uniformity by controlling the amount of consumption of the reducing agents is controlled on the surface opposite to that of each substrate 8 mounted on the receiver 7.

As described above, in order to deposit silicon nitride layers after elimination of the natural oxide films, the temperature of the treating chamber is decreased down to 750° C. and this temperature is maintained, while keeping the pressure of the treating chamber to a vacuum of about 1 Torr. Then, argon gas of 5 SLM or more is caused to flow from the blow-off nozzle 6 in order to prevent a thin natural oxide film from being formed again on the polysilicon layer (203 or 303). As a result, an oxidizer such as water and oxygen flowing into the treating chamber from outside through connecting portions such as the O-shaped ring 14, does not remain in the treating chamber.

After the temperature of the treating chamber is stabilized at 750° C., ammonia gas of 500 SCCM, silane gas of 30 SCCM, and argon gas of 360 SCCM are supplied to the treating chamber to deposit a silicon nitride layer. The silicon nitride layer can thus be formed on the surface of the polysilicon layer (203 or 303), without interposing any natural oxide film between them.

To form a silicon oxide layer or a silicon nitride layer on the undersurface of a member opposite to the surface of the substrate 8, the dummy silicon substrate of the first embodiment can be replaced with a non-silicon dummy substrate such as a quartz-made disk having the same shape as that of the silicon substrate. However, when each set of substrate 8 and dummy substrate is mounted on the boat of shelves of the receiver 7, the number of substrates 8 to be treated at once is reduced by half. To prevent this problem, a silicon oxide layer or a silicon nitride layer is provided on the undersurface (on which no semiconductor device is manufactured) of each substrate 8 to oppose the undersurface of the substrate and the surface (on which a semiconductor device is manufactured) of another substrate 8 to each other. By doing so, the foregoing effect can be obtained, without reducing the number of substrates 8 by half.

A method for manufacturing a semiconductor device according to a second embodiment of the present invention, will now be described.

In the second embodiment, a plurality of substrates 8 on which silicon oxide layers having different patterns are formed, are treated to remove natural oxide films therefrom at the same time using the LPCVD apparatus shown in FIG. 1. After that, silicon layers are deposited on the substrates 8 by silicon epitaxial growth.

First an outline of the method according to the second embodiment will be described.

The substrates mounted on a substrate receiver includes a first substrate to be treated. The area of the treatment surface of the first substrate is $S_1$, and that of the silicon oxide layer on the treatment surface is $A_1$. In the substrate receiver, a first dummy substrate is mounted opposite to the first substrate. The undersurface of the first dummy substrate is opposed to the treatment surface of the first substrate. The area of the undersurface of the first dummy substrate is $S_2$, that of the silicon oxide layer on the undersurface of the first dummy substrate is $B_2$, and the area of the material such as a silicon nitride layer and a silicon layer, which is harder to react to a reducing agent than a silicon oxide layer, or the area of the substrate is $(S_2-B_2)$.

Similarly, the substrates mounted on the substrate receiver includes a second substrate to be mounted. The area of the treatment surface of the second substrate is $S_3$, and that of the silicon oxide layer on the treatment surface is $A_3$. In the substrate receiver, a second dummy substrate is mounted opposite to the second substrate. The undersurface of the second dummy substrate is opposed to the treatment surface of the second substrate. The area of the undersurface of the second dummy substrate is $S_4$, that of the silicon oxide layer on the undersurface of the second dummy substrate is $B_4$, and the area of the material such as a silicon nitride layer and a silicon layer, which is harder to react to a reducing agent than a silicon oxide layer, or the area of the substrate is $(S_4-B_4)$.

The reducing gas guided into the treating chamber flows into a gap between the first substrate and its opposite first dummy substrate, and oxides including the natural oxide films on the surfaces of the respective substrates are reduced. Since, in this case, the areas $A_1$ and $B_2$ represent the silicon oxide layers of the treatment surface of the first substrate and the undersurface of the first dummy substrate, respectively, the reducing agents are consumed only on the silicon oxide layers $(A_1+B_2)$ after all the natural oxide films are eliminated from the surfaces of the silicon oxide layers.

The reducing agents flow into a gap between the second substrate and its opposite second dummy substrate, and oxides including the natural oxide films on the surfaces of the respective substrates are reduced. Since, in this case, the areas $A_3$ and $B_4$ represent the silicon oxide layers of the treatment surface of the first substrate and the undersurface of the first dummy substrate, respectively, the reducing agents are consumed only on the silicon oxide layers $(A_3+B_4)$ after all the natural oxide films are eliminated from the surfaces of the silicon oxide layers.

If the area of $A_1+B_2$ and that of $A_3+B_4$ are set to be equal to each other, the quantity of reducing agents consumed in the gap between the first substrate and the first dummy substrate becomes equal to that of reducing agents consumed in the gap between the second substrate and the second dummy substrate.

If, therefore, the reducing agents are equally supplied into all the gaps between the respective substrates, the effective pressure of the reducing agents can be equalized on the first and second substrates whose silicon oxide layers differ in area from each other, and the natural oxide films can be eliminated completely from both the substrates.

The amounts of reducing gas on the nearby side of the inlet and the far side thereof (e.g., near the outlet) in the treating chamber differ from each other (e.g., near the inlet). Usually, the partial pressure of the reducing gas is high in the vicinity of the inlet and low in the vicinity of the outlet. By increasing the consumption of the reducing gas by increasing the area of an oxide on the undersurface of the dummy substrate in the vicinity of the inlet, the partial pressure of the reducing gas is lowered in the gap between the substrate and its opposite dummy substrate. On the contrary, by decreasing the consumption of the reducing gas on the undersurface of the dummy substrate in the vicinity of the outlet, the partial pressure of the reducing gas is increased and can thus be supplied uniformly to a plurality of substrates.

The method according to the second embodiment will be described specifically.

Figure 4:
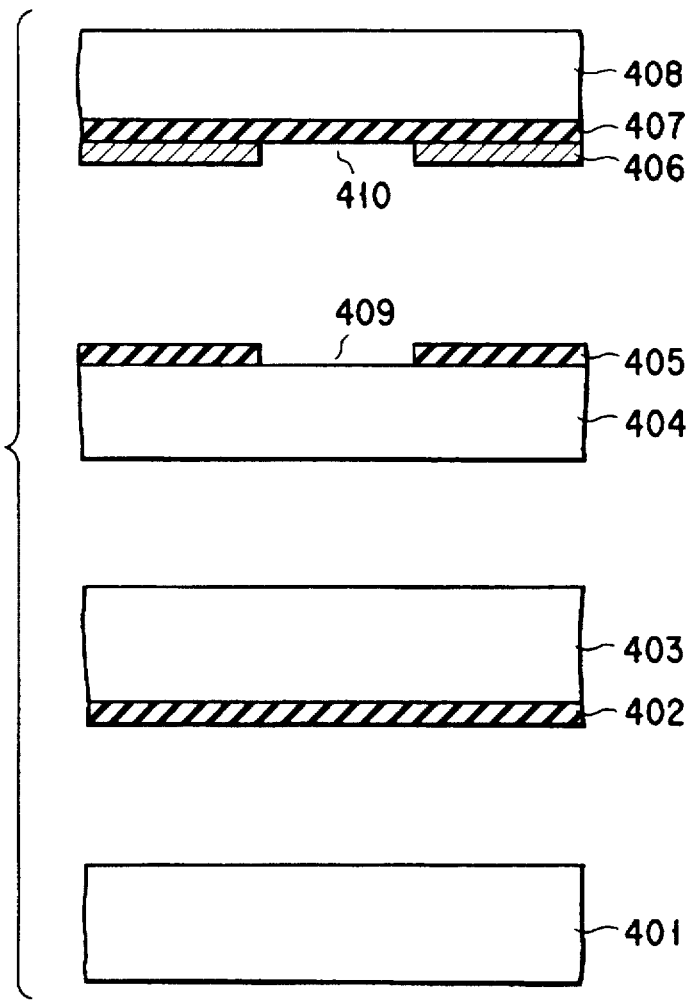
FIG. 4 is a view for explaining a method of simultaneously treating a plurality of substrates having silicon oxide layers whose areas differ from one another, in a method for manufacturing a semiconductor device according to a second embodiment of the present invention.

FIG. 4 shows a plurality of substrates to be treated and dummy silicon substrates mounted on the boat of shelves of the receiver 7 of FIG. 1.

As shown in FIG. 4, a silicon substrate 403 serving as a first dummy substrate is mounted on one shelf above a silicon substrate 401 serving as a first substrate to be treated. A silicon oxide layer 402 having a thickness of 100 nm is formed on that undersurface of the silicon substrate 403 which is opposed to the first substrate 401.

A silicon substrate 404 serving as a second substrate to be treated is mounted on one shelf above the silicon substrate 403. A silicon oxide layer 405 having a thickness of 100 nm is formed on the surface (on which a semiconductor device is to be manufactured) of the silicon substrate 404. An opening 409 is formed in the silicon oxide layer 405 by patterning, and the silicon substrate 404 is exposed to the bottom of the opening 409.

A silicon substrate 408 serving as a second dummy substrate is mounted on one shelf above the second substrate 404. A silicon oxide layer 407 having a thickness of 100 nm is formed on that undersurface of the silicon substrate 408 which is opposed to the second substrate 404, and a polysilicon layer 406 is formed on the silicon oxide layer 407. An opening 410 is formed in the polysilicon layer 406 by patterning, and the silicon oxide layer 407 is exposed to the bottom of the opening 410.

Assume that the area of each of the surfaces of the first and second substrates 401 and 404 and the undersurfaces of the first and second dummy substrates 403 and 408 is S, the area of the bottom of the opening 409 is a, and the area of the bottom of the opening 410 is b. In the second embodiment, the areas a and b are set to be equal to each other with an error of 30% or less.

A case where a natural oxide film is eliminated by reducing treatment using monosilane gas before a monocrystalline silicon layer is epitaxially grown on the surface of the first substrate 401 and that of the second substrate 404 exposed by the opening 409, will now be described.

The monosilane gas guided into the treating chamber flows into a gap between the first substrate 401 and first dummy substrate 403, and is consumed by reducing and eliminating the natural oxide film from the surface of the substrate 401 and by etching the surface of the silicon oxide layer 402 on the first dummy substrate 403. In the gap between the substrate 401 and dummy substrate 403, the area of contact of the monosilane gas and natural oxide film is S, and the area of contact of the monosilane gas and silicon oxide layer 402 is S.

In contrast, the monosilane gas flowing into a gap between the second substrate 404 and second dummy substrate 408 is consumed by reducing and eliminating the natural oxide film from the bottom of the opening 409 and the natural oxide film from the surface of the polysilicon layer 406 and by etching the silicon oxide layer 405 and the silicon oxide layer 407 exposed by the opening 410. In the gap between the substrate 404 and dummy substrate 408, the area of the silicon oxide layer occupying the substrate is (S−a)+b, and the area of the natural oxide film occupying the surface of the substrate is a+(S−b).

When the monosilane gas is supplied on the same conditions as those of the first embodiment, the total amount of the monosilane gas flowing into the gap between the first substrate 401 and first dummy substrate 403 is considered to be almost equal to that of the monosilane gas flowing into the gap between the second substrate 404 and second dummy substrate 408, if the locations of the two substrates 401 and 404 are almost the same.

The monosilane gas is gradually decreased in the process of eliminating all the natural oxide films of 2 to 3 nm from the silicon substrates. Since no reducing reaction occurs on the surfaces of the substrates after all the natural oxide films are eliminated therefrom, the monosilane gas is not consumed.

Since the silicon oxide layer 402 is sufficiently thick and its thickness is 100 nm or more, not all the layer is removed by the reducing treatment, and it continues to be treated by the reducing reaction during the reducing treatment. Therefore, the amount of consumption of the monosilane gas varies with the areas of the silicon oxide layer and the natural oxide film.

According to the second embodiment, even though the areas of the silicon oxide layers and the natural oxide films vary according to the respective substrates to be treated, these areas can be adjusted by the dummy substrates opposite to the substrates. For this reason, the total amount of consumption of the monosilane gas can be controlled so as to be fixed, and the same partial pressure of the monosilane gas can be applied to all the substrates. Consequently, neither the natural oxide film remains nor the polysilicon is deposited by excessively increasing the partial pressure of the monosilane gas, and the natural oxide film can be uniformly eliminated.

As described above, after the natural oxide films are eliminated, the temperature of the treating chamber is decreased down to 750° C., while keeping the pressure of the treating chamber to a vacuum of about 1 Torr. Then, argon gas of 5 SLM or more is caused to flow from the blow-off nozzle 6 in order to prevent a thin natural oxide film from being formed again on the treating surface of the first substrate 401 and on the bottom surface of the opening 409 on the second substrate 404. Thus, an oxidizer such as water and oxygen flowing into the treating chamber from outside through connecting portions such as the O-shaped ring 14 (in FIG. 1), does not remain in the treating chamber.

After the temperature of the treating chamber is stabilized at 750° C., monosilane gas of 100 SCCM and hydrogen of 1000 SCCM are supplied into the treating chamber. Thus, silicon is epitaxially grown on the treating surface of the first substrate 401 and the bottom surface of the opening 409 on the second substrate 404, with the result that a silicon layer can be formed.

In the above embodiments, silicon hydride such as monosilane is used as a reducing agent. However, the present invention is not limited to this, but the silicon hydride can be replaced with hydrogen, chloride such as dichlorosilane, and fluoride such as silane fluoride.

According to the present invention described above, when the surfaces of a plurality of substrates are treated by reducing reaction in the treating chamber, the amount of supply of reducing agents can be controlled independently for each of the substrates by controlling the amount of consumption of the reducing agents on the surfaces opposite to the substrates. In other words, the reducing agents can be supplied to the substrates at the same time so as to have an appropriate amount for each of the substrates. It is thus possible to simultaneously carry out reducing reaction treatment (e.g., elimination of natural oxide films) for a large variety of substrates with high uniformity.

Consequently, the number of substrates which can be treated at once, can be increased, and high throughput and low cost can be achieved, as compared with the conventional methods.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of eliminating a natural oxide from a target surface of each of a plurality of objects to be treated by reducing the target surface using a semiconductor device manufacturing apparatus, including a chamber, an inlet for guiding gas containing a reducing agent to the chamber, and a receiver for receiving the plurality of objects to be treated, provided in the chamber, said method comprising the steps of:

arranging the plurality of objects to be treated in the receiver;

respectively opposing a first member and a second member, both for controlling the reducing agent, to at least a target surface of a first one of the plurality of objects to be treated and to a target surface of a second one thereof, which is separated from the first object to be treated, said first member increasing an amount of consumption of the reducing agent and said second member decreasing the amount of consumption of the reducing agent; and guiding the gas containing the reducing agent from the inlet to the chamber to reduce at least said target surfaces of said first and second objects to be treated.

2. The method according to claim 1, wherein the plurality of objects to be treated are arranged along a direction in which the gas containing the reducing agent flows.

3. The method according to claim 2, wherein silicon is exposed from the target surface of each of said plurality of objects to be treated, and said natural oxide is $SiO_2$.

4. The method according to claim 3, wherein said reducing agent includes one of hydrogen, silicon hydrides, compounds containing chlorine, and compounds containing fluorine.

5. The method according to claim 4, wherein said silicon hydrides include monosilane, said compounds containing chlorine include dichlorosilane, and said compounds containing fluorine include silane fluoride.

6. The method according to claim 3, wherein said first member includes a silicon oxide to increase the amount of consumption of the reducing agent, and said second member includes a silicon nitride to decrease the amount of consumption of the reducing agent.

7. The method according to claim 3, wherein said plurality of objects to be treated are wafers, said first member is a layer including a silicon oxide formed on a surface of a first dummy wafer, and said second member is a layer including a silicon nitride formed on a surface of a second dummy wafer.

8. The method according to claim 3, wherein said plurality of objects to be treated are wafers, the first one of the plurality being a first wafer and the second one of the plurality being a second wafer, said first member is a layer including a silicon oxide layer on an undersurface of a third wafer opposite to the target surface of the first wafer, and said second member is a layer including a silicon nitride layer on an undersurface of a fourth wafer opposite to the target surface of the second wafer.

9. The method according to claim 2, wherein treated area of a layer in the target surface of said first object is a layer of area A1, effective area of a surface of said first member is a silicon oxide layer of area B2, treated area of a layer in the target surface of said second object to be treated is layer of area A3, and effective area of a surface of said second member is a silicon oxide layer of area B4, wherein A1+B2 is larger than A3+B4.

10. A method for manufacturing a semiconductor device, said method comprising the steps of:

arranging a plurality of substrates to be treated and a plurality of members in a treating chamber in such a manner that an undersurface of each of the members is opposed to a top surface of each of said substrates and that said members and said substrates to be treated are spaced from each other; the top surface of each substrate having a silicon oxide layer formed thereon and the undersurface of each member having a silicon oxide layer formed thereon;

guiding a reducing gas into said treating chamber;

controlling reaction of a reducing agent to the undersurface of each of the members to supply a reducing gas in a controlled amount to the surface of each of the substrates, wherein, the area of the top surface of each of the substrates is $S_n$ (n=1 to N, N is an integer), the area of the silicon oxide layer on the area $S_n$ of the top surface of each substrate is $A_n$ (n=1 to N), the area of the undersurface of each of the members is $S_m$ (m=1 to N), and the area of the silicon oxide layer on the area $S_m$ of the undersurface of each member is $B_n$ (n=1 to N), the area $B_n$ is set in such a manner that ratios of $(A_n+B_n)$ to $S_n$ for all N substrates and members are equal to one another with an error of 30% or less, the area $S_m$ of the undersurface of each member being equal to the area $S_n$ of the top surface of each substrate, the area $A_n$ being equal to or different from the area $B_n$.

11. The method according to claim 10, wherein said plurality of members are substrates other than said plurality of substrates to be treated.

12. A method for manufacturing a semiconductor device, said method comprising the steps of:

arranging a plurality of first substrates to be treated and a plurality of second substrates to be treated in a treating chamber in such a manner that an undersurface of each of said first substrates is opposed to a top surface of each of said second substrates and that said first and second substrates are spaced from each other; the top surface of each substrate having a silicon oxide layer formed thereon, and the undersurface of each substrate having a silicon oxide layer formed thereon;

guiding a reducing gas into said treating chamber; and controlling reaction of a reducing agent to the undersurface of said first substrates to be treated, thereby supplying the reducing gas in a controlled amount to the surface of said second substrates to be treated, wherein, the area of an undersurface of each of the first substrates is $S_n$ (n=1 to N, N being an integer), and the area of the silicon oxide layer on the area $S_n$ is $B_n$ (n=1 to N), an area $B_1$ of a silicon oxide layer occupying an undersurface of a substrate arranged near an inlet for guiding the reducing gas is set to be larger than an area $B_2$ of a silicon oxide layer occupying an undersurface of a substrate arranged far from the inlet.

* * * * *